United States Patent
Cha

(10) Patent No.: US 11,202,387 B2
(45) Date of Patent: Dec. 14, 2021

(54) MOUNTING RAILS WITH DOVETAIL LUGS

(71) Applicant: HEWLETT-PACKARD DEVELOPMENT COMPANY, L.P., Houston, TX (US)

(72) Inventor: Dong Ryul Cha, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 535 days.

(21) Appl. No.: 16/083,268

(22) PCT Filed: Apr. 4, 2017

(86) PCT No.: PCT/US2017/026006
§ 371 (c)(1),
(2) Date: Sep. 7, 2018

(87) PCT Pub. No.: WO2018/186841
PCT Pub. Date: Oct. 11, 2018

(65) Prior Publication Data
US 2021/0092864 A1   Mar. 25, 2021

(51) Int. Cl.
*H05K 7/18* (2006.01)
*F16M 13/02* (2006.01)
*H05K 5/02* (2006.01)

(52) U.S. Cl.
CPC .............. *H05K 7/183* (2013.01); *F16M 13/02* (2013.01); *H05K 5/0204* (2013.01)

(58) Field of Classification Search
None
See application file for complete search history.

(56) References Cited

U.S. PATENT DOCUMENTS 3,442,311 A * 5/1969 Rhyne ...................... B27F 1/00
                                                        144/354
5,588,726 A * 12/1996 Lee ........................ F16B 12/02
                                                        312/263

(Continued)

FOREIGN PATENT DOCUMENTS

DE         19525518 C1    12/1996
KR      20000044438 A      7/2000

(Continued)

OTHER PUBLICATIONS

"Explore Workerman Sound, Stripp Headphone and More!", Pinterest, Retrieved from Internet—https://in.pinterest.com/pin/102527328992708478/, 2017, 3 Pages.

(Continued)

*Primary Examiner* — Xanthia C Cunningham
(74) *Attorney, Agent, or Firm* — HP Inc. Patent Department

(57) ABSTRACT

In an example, a mounting rail may include a base and a dovetail lug. The dovetail lug may extend from the base and may also extend along a width of the base. The dovetail lug may include a bottom portion having a first thickness, and a top portion having a second thickness. The second thickness may be larger than the first thickness. In further implementations, the bottom portion and the top portion may define a front overhang and a back overhang of the dovetail lug.

12 Claims, 6 Drawing Sheets

(56) References Cited

U.S. PATENT DOCUMENTS

| | | | |
|---|---|---|---|
| 5,775,046 A * | 7/1998 | Fanger | A47B 81/06 |
| | | | 108/157.16 |
| 5,852,545 A | 12/1998 | Pan-Ratzlaff | |
| 6,357,194 B1 * | 3/2002 | Jones, Jr. | F16B 12/125 |
| | | | 52/590.1 |
| 6,795,318 B2 * | 9/2004 | Haas | H04M 1/0254 |
| | | | 361/728 |
| 7,051,489 B1 * | 5/2006 | Swiszcz | E04B 9/0442 |
| | | | 160/84.05 |
| 7,987,647 B2 * | 8/2011 | Rymell | E04D 3/3608 |
| | | | 52/506.06 |
| 8,018,726 B2 * | 9/2011 | Friedlander | H01R 13/514 |
| | | | 361/732 |
| 8,960,618 B2 | 2/2015 | Chen | |
| 9,256,254 B2 | 2/2016 | Appleton | |
| 9,607,660 B2 * | 3/2017 | Bennett, II | G11B 33/00 |
| 10,632,643 B1 * | 4/2020 | Carper | B26B 29/06 |
| 2006/0096212 A1 * | 5/2006 | Panasik | E04D 13/1643 |
| | | | 52/408 |
| 2008/0163573 A1 * | 7/2008 | Wendelburg | E04D 3/3608 |
| | | | 52/262 |
| 2009/0244836 A1 | 10/2009 | Leng et al. | |
| 2011/0100509 A1 * | 5/2011 | Sugita | B27F 1/12 |
| | | | 144/144.51 |
| 2011/0188178 A1 * | 8/2011 | Myers | H05K 5/0208 |
| | | | 361/679.01 |
| 2012/0298817 A1 * | 11/2012 | West | F24S 25/70 |
| | | | 248/220.22 |
| 2019/0338678 A1 * | 11/2019 | Sultana | F01D 25/285 |

FOREIGN PATENT DOCUMENTS

| | | |
|---|---|---|
| RU | 2152313 C1 | 7/2000 |
| SU | 687478 A1 | 9/1979 |
| WO | 2001061970 A2 | 8/2001 |

OTHER PUBLICATIONS

"Magnetic Headset Holder", Enermax, Retrieved from Internet—http://www.enermax.it/products/peripherals/headset-holder/, 2017, 1 Page.

* cited by examiner

MOUNTING RAILS WITH DOVETAIL LUGS

BACKGROUND

Electronic devices such as computing devices may engage with or be used in conjunction with other devices such as accessories or peripheral devices. Such accessories or peripheral devices may be plugged into the electronic devices, or may be isolated and used separately from the electronic devices. In some situations, accessories and/or peripheral devices may be kept on a work surface such as a desk, table, or other surface in order to stow such devices.

DETAILED DESCRIPTION

Electronic devices such as computing devices may engage with or be used in conjunction with other devices such as accessories or peripheral devices. Such devices may include headphones, speakers, microphones, mobile device mounts or stands, antennas, mice, joysticks or other game controllers, virtual reality headsets, or other accessories or peripheral devices. Such devices may be plugged into the electronic device, or may be isolated and used separately from the electronic device. In some situations, accessories or peripheral devices may be kept on a work surface such as a desk, table, or other surface, or may be put away in a drawer or other location in order to stow the device. Stowing accessories or peripheral devices in a drawer, cabinet, or other location may be inconvenient and may prevent the device from being quickly and easily accessed, picked up, and/or used. Additionally, stowing the accessories or peripheral devices by leaving them on a convenient and/or nearby work surface, such as a desk or table, may clutter the work surface and may inhibit the efficient use of such a work surface.

In some situations, it may be desirable to put away or stow accessories or peripheral devices in a manner that may keep the devices out of the way and avoid clutter, yet may still enable the accessories and peripheral devices to be quickly and easily accessed for use. Further, it may be desirable that such a manner of stowing the accessories or peripheral devices may be physically located near a computing device, such as a personal computer (PC) or workstation, for example. In yet further situations, it may be desirable for an accessory, for example a mobile device or tablet, to be held or mounted out of the way, yet still be able to be viewed or used at the same time.

Implementations of the present disclosure provide mounting rails that may be used as part of a mounting system to hang or otherwise stow accessories or peripheral devices. Further, implementations of the present disclosure may provide mounting rails that may be used with or attached to electronic devices, and/or enclosures thereof, such that accessories or peripheral devices may be stowed or kept near such electronic devices for quick and easy access to the accessory or peripheral device without creating clutter or inhibiting efficient use of the area around the electronic device. Additionally, in some implementations of the present disclosure, such mounting rails or mounting systems may enable a device to be held or mounted in a position that is both out of the way and also able to be used at the same time.

Figure 1A:
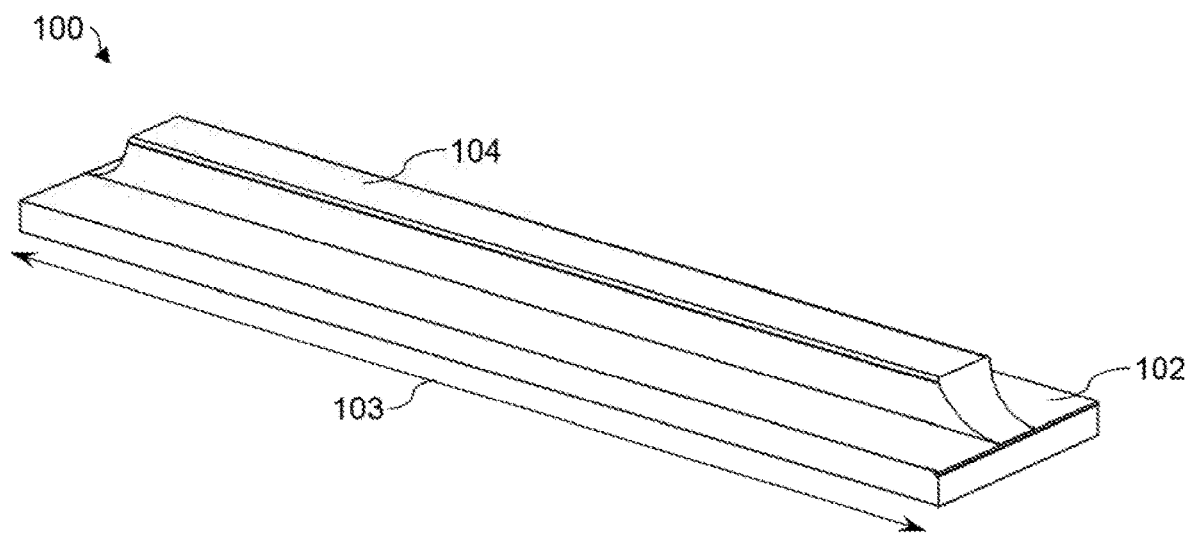
FIG. 1A is a perspective view of an example mounting rail.
Figure 1B:
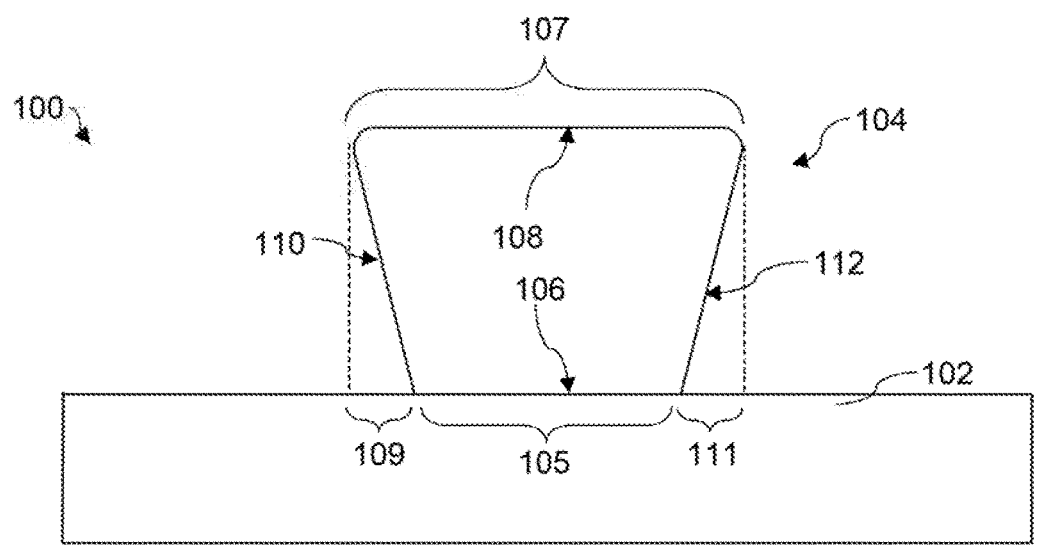
FIG. 1B is a side view of an example mounting rail.

Referring now to FIG. 1A, a perspective view of an example mounting rail 100 is illustrated. Example mounting rail 100 may include a base 102 and a dovetail lug 104. The dovetail lug 104 may extend from the base 102 and may also extend along a width or a span 103 of the base 102. In some implementations, the dovetail lug 104 may only extend along a portion of the width 103, or may be segmented or broken into separate portions along the width 103. Referring now to FIG. 1B, a side view of the example mounting rail 100 is illustrated. The dovetail lug 104, in some implementations, may include a bottom portion 106 having a first width or thickness 105, and a top portion 108 having a second width or thickness 107. The second thickness 107 may be larger than the first thickness 105, in some implementations. In further implementations, the bottom portion 106 and the top portion 108 may define a front overhang 109 and a back overhang 111 of the dovetail lug 104. Each of the front overhang 109 and the back overhang 111 may extend outward from the bottom portion 106 to the top portion 108. In some implementations, each of the front overhang 109 and the back overhang 111 may result from the top portion 108 extending beyond the bottom portion 106 on both a front side or edge and a back side or edge of the dovetail lug 104. The front overhang 109 and the back overhang 111 may extend into the page of FIG. 1B and along the front edge and the back edge, respectively, of the dovetail lug 104. Therefore, in some situations, the second thickness may be equal to the first thickness plus the distance of both the front overhang 109 and the back overhang 111.

Although illustrated as having a substantially trapezoidal cross-section, the dovetail lug 104 may have another cross-sectional shape. In some implementations, the dovetail lug 104 may have a T-shaped cross-section or a substantially T-shaped cross-section, or a cross-section of another shape having a front overhang 109 and a back overhang 111. In other implementations, it is contemplated that the dovetail lug 104 may have a cross-sectional shape that may only have a single overhang, or an overhang on only one side or edge of the dovetail lug 104. Such a single overhang cross-section may be L-shaped, J-shaped, or may have another suitable shape.

In the illustrated implementation, the dovetail lug 104 is illustrated as having a substantially trapezoidal cross-section. In this context, substantially trapezoidal may refer to a cross-sectional shape wherein a single surface extends from the bottom portion 106 to the top portion 108 to define each of the front overhang 109 and the back overhang 111. In the illustrated implementation, the dovetail lug 104 may include a front retention surface 110 and a back retention surface 112. The front retention surface 110 and the back retention surface 112 may each extend outward from the bottom portion 106 of the dovetail lug 104 to the top portion 108 of the dovetail lug 104 so as to define the front overhang 109 and the back overhang 111. In other implementations, one or both of the front retention surface 110 and the back retention surface 112 may include more than a single surface, i.e., multiple surfaces may be cooperatively disposed together to define the front and/or back overhang.

Figure 2A:
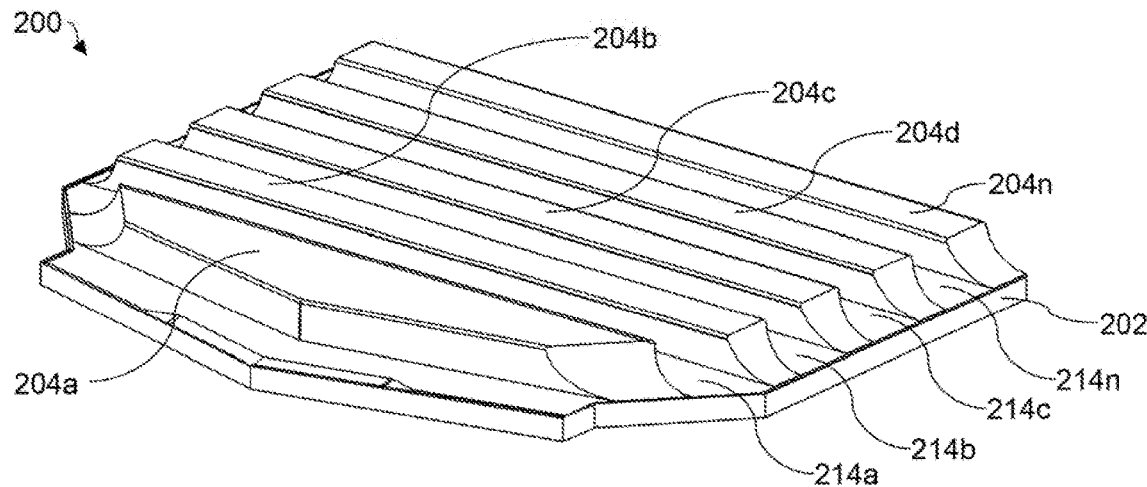
FIG. 2A is a perspective view of an example mounting rail.

Referring now to FIG. 2A, a perspective view of an example mounting rail 200 is illustrated. Example mounting rail 200 may be similar to example mounting rail 100. Further, the similarly-named elements of example mounting rail 200 may be similar in function and/or structure to the respective elements of example mounting rail 100, as they are described above. Example mounting rail 200 may include a plurality of dovetail lugs 204a, 204b, 204c, 204d . . . 204n (hereinafter collectively referred to as dovetail lugs 204), arranged in an array across a base 202 of the mounting rail 200. The plurality of dovetail lugs 204 may include more or fewer dovetail lugs 204 than is illustrated, in some implementations.

The base 202 may be a plate, substrate, or another component suitable to structurally orient and support the plurality of dovetail lugs 204. In some implementations, the base 202 may be engageable with another component of an electronic device such as a computing device. For example, in some implementations, the base 202 may be removably attachable or engageable with a computing device enclosure, or a chassis thereof. In other words, the base 202 may enable the mounting rail 200 to be attached and detached as desired to a computing device, or a chassis or enclosure thereof.

Each dovetail lug 204 may be a rib, rail, beam, or another protrusion extending from the base 202 of the mounting rail 200. In some implementations, each or any dovetail lug 204 of the plurality of dovetail lugs 204 may be a unitary, integral part of the mounting rail 200, or the base 202 thereof. In other implementations, each or any of the dovetail lugs 204 may be a separate, discrete component that may be fastened to or assembled on to the mounting rail 200, or the base 202 thereof. In further implementations, each dovetail lug 204 of the plurality of dovetail lugs 204 may be spaced apart from an adjacent dovetail lug 204 so as to define a retention channel 214. For example, dovetail lug 204b may be spaced apart from dovetail lug 204c so as to define retention channel 214b in between dovetail lug 204b and dovetail lug 204c. Accordingly, in further implementations, the mounting rail 200 may include a plurality of retention channels 214a, 214b, 214c . . . 214n (hereinafter collectively referred to as retention channels 214). In other words, any given retention channel 214 may be one of the plurality of retention channels 214, defined by the plurality of dovetail lugs 204.

Figure 2B:
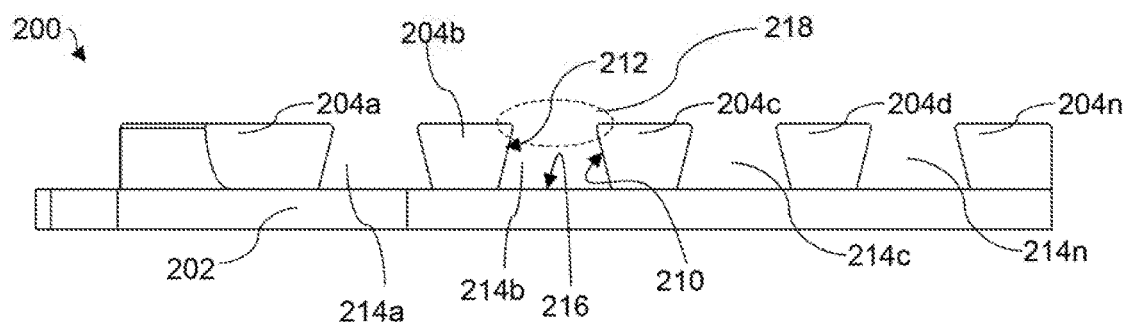
FIG. 2B is a side view of an example mounting rail.

Referring now to FIG. 2B, a side view of the example mounting rail 200 is illustrated. Each retention channel 214 may be a cavity or passage in the mounting rail 200, and may be suitably shaped and structured so as to receive and retain a dovetail lug within the retention channel. In some implementations, each retention channel 214 may be suitably shaped and structured to receive a lug of a different geometry other than a dovetail. In the illustrated implementation, using retention channel 214b as an example, each retention channel may have a channel floor 216 having a floor width, and a channel throat 218 having a throat width, which may be smaller or shorter than the floor width 216a. In some implementations, the channel throat 218 of the retention channel 214 may be defined by a front overhang of one dovetail lug 204 of the plurality of dovetail lugs 204, and the back overhang of an adjacent dovetail lug 204 of the plurality of dovetail lugs 204. For example, in the illustrated implementation, a front retention surface 210 of dovetail lug 204c may define, at least partially, the front overhang of dovetail lug 204c, as described above. Similarly, a back retention surface 212 of dovetail lug 204b may define, at least partially, the back overhang of dovetail lug 204b. The front retention surface 210 and the back retention surface 212 may be similar to front retention surface 110 and back retention surface 112, respectively, as they are described above. Thus, retention channel 214b, and the channel floor 216 and the channel throat 218 thereof, disposed in between dovetail lug 204b and dovetail lug 204c, may be defined by front retention surface 210 and back retention surface 212. Stated yet differently, the bottom portion of two adjacent dovetail lugs may define the channel floor of a retention channel disposed in between such dovetail lugs, and the top portions of the two adjacent dovetail lugs may define the channel throat of such retention channel.

In implementations wherein the dovetail lugs have a cross-section that defines only a single overhang, such as an L-shape or J-shape, the corresponding retention channels disposed in between such dovetail lugs may have retention throats that are defined by the single overhang. In some implementations, each retention channel 214 may have a cross-section shape that is the inverse to the cross-section shape of the adjacent dovetail lugs that define the retention channel. For example, in the illustrated implementation, some or all of the dovetail lugs 204 may have a substantially trapezoidal cross-section. Accordingly, some or all of the retention channels 214 may have an inverse trapezoidal cross-section.

The plurality of retention channels 214 may be arranged in an array that may be alternatingly disposed along the plurality of dovetail lugs 204, or the array thereof. Stated differently, the dovetail lugs 204 and the retention channels 214 may alternate with one another, such that some of the retention channels 214 of the plurality of retention channels 214 are disposed between two dovetail lugs, and some of the dovetail lugs 204 of the plurality of dovetail lugs 204 may be disposed in between two retention channels 214. In further implementations, dovetail lugs 204 disposed on the ends of the array of dovetail lugs 204, dovetail lug 204a and dovetail lug 204n, in the illustrated example, may only be disposed next to a single retention channel, retention channel 214a and retention channel 214n, respectively, in the illustrated example. As such, the dovetail lugs 204 that are disposed on the ends of the array may only have one retention surface and/or one overhang to partially define the single retention channel 214 adjacent to the respective end dovetail lug 204.

Figure 3A:
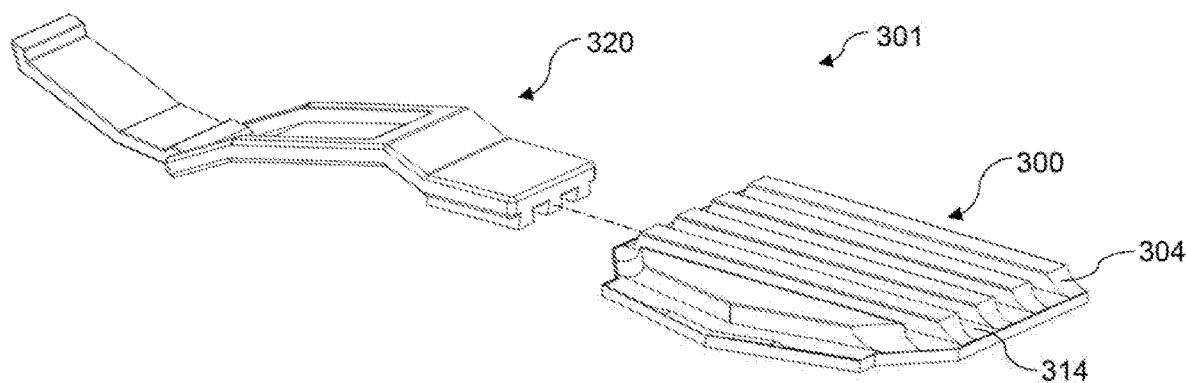
FIG. 3A is a perspective view of an example mounting system having an example mounting rail.
Figure 3B:
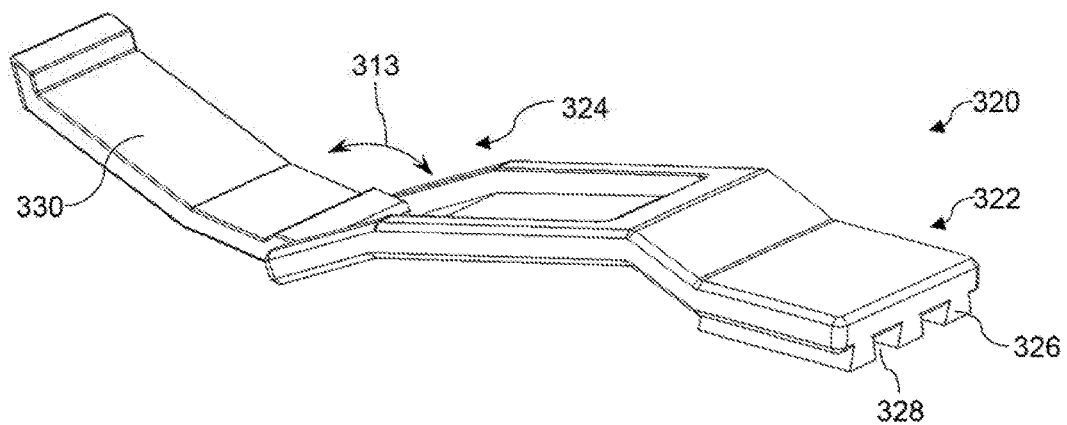
FIG. 3B is a perspective view of an example device mount of an example mounting system.

Referring now to FIG. 3A, a perspective view of an example mounting system 301 is illustrated. The example mounting system 301 may include an example mounting rail 300 and an example device mount 320. Example mounting rail 300 may be similar to other above-described example mounting rails. Further, the similarly-named elements of example mounting rail 300 may be similar in function and/or structure to the respective elements of other example mounting rails, as they are described above. Referring additionally to FIG. 3B, a detail perspective view of the device mount 320 is illustrated. Device mount 320 may include an attachment portion 322 to attach to, fix to, or engage with the mounting rail 300, and a device portion 324 fixed to the attachment portion 322 to hold, hang, or otherwise support or engage with a device, for example, an accessory or peripheral device. The device portion 324 may have a variety of structures or shapes to support or engage with a variety of different accessories or peripheral devices. In the illustrated implementations, the device portion 324 may include a hanger 330 that is pivotably attached to the attachment portion 322. As such, the hanger 330 may pivot in a direction similar to direction 313 in order to move from a stowed position to a hanging position, as illustrated in FIG. 3B. When disposed in the hanging position, the device portion 324, or the hanger 330 thereof, may receive an accessory or peripheral device, for example a pair of headphones or a headset, such that the accessory or peripheral device may hang from the device portion 324.

Figure 3C:
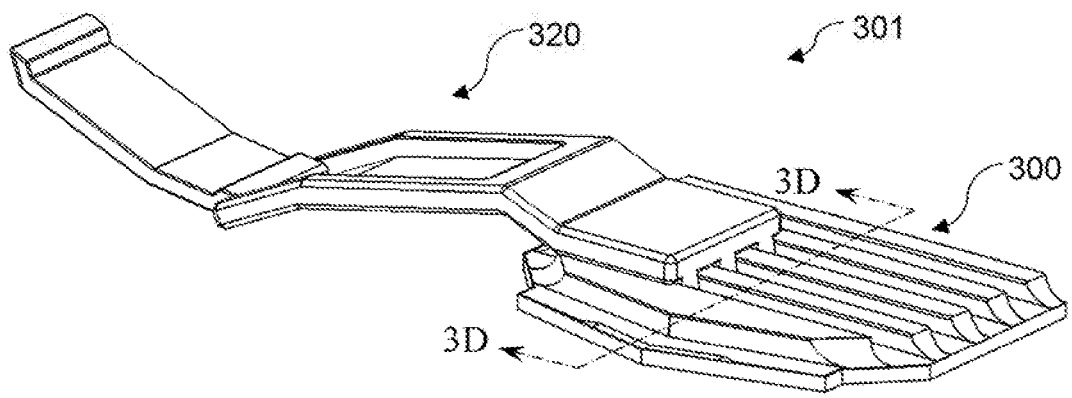
FIG. 3C is a perspective view of an example mounting system having an example mounting rail.

The attachment portion 322 may include an attachment lug 326. In some implementations, the attachment portion 322 may include a plurality of attachment lugs 326 so as to also include an attachment channel 328. Referring now to FIG. 3C, a perspective view of the example mounting system 301 is illustrated, wherein the device mount 320 is assembled on to, fixed to, attached to, retained to or on, or otherwise engaged with the mounting rail 300. In some implementations, the attachment portion 322 may have a single attachment lug 326. In such an implementation, the mounting rail 300 may have a first dovetail lug and a second dovetail lug spaced apart from the first dovetail lug so as to define a retention channel in between the first dovetail lug and the second dovetail lug. In further implementations, the retention channel may have a matching cross-section to that of the attachment lug 326 so as to receive and retain the attachment lug 326.

In yet another implementation, instead of a single attachment lug 326, the attachment portion 322 may have a first attachment lug and a second attachment lug spaced apart from the first attachment lug so as to define an attachment channel. Further, in such an implementation, the mounting rail 300 may have a single dovetail lug. The attachment channel may have a matching cross-section to that of the dovetail lug so as to receive and retain the dovetail lug of the mounting rail 300.

Figure 3D:
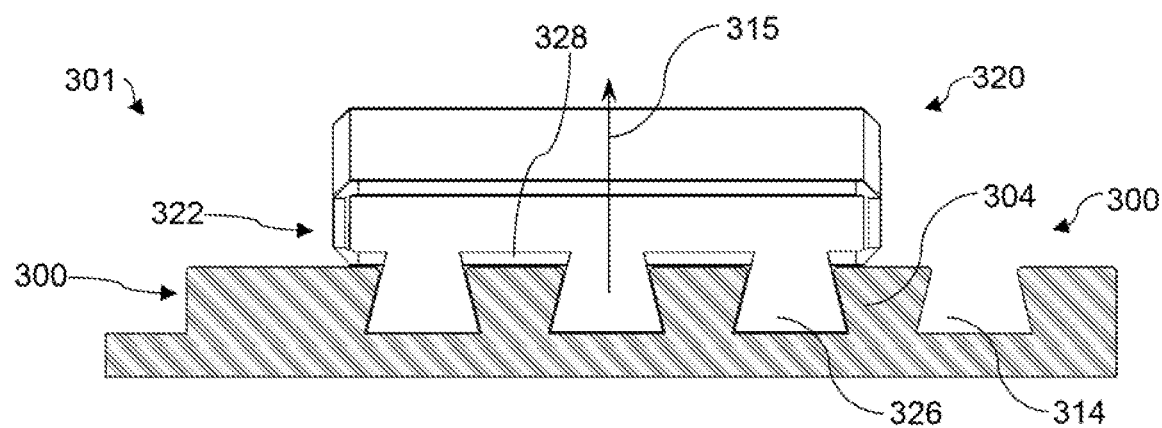
FIG. 3D is a cross-sectional view of an example mounting system having an example mounting rail.

Referring additionally to FIG. 3D, a cross-sectional view of the example mounting system 301, taken along view line 3D-3D of FIG. 3C, is illustrated. In the illustrated implementation, the attachment lug 326 may be part of a plurality of attachment lugs 326 disposed in or arranged in an array along or across the attachment portion 322. In some implementations, each of the plurality of attachment lugs 326 may be similar to the dovetail lugs 304 described herein, or dovetail lugs described above. The plurality of attachment lugs 326 may be spaced apart from each other and arranged so as to define a plurality of attachment channels 328, also disposed along or arranged in an array along or across the attachment portion 322. Additionally, each of the plurality of attachment channels 328 may be similar to retention channels 314 described herein, or other retention channels described above. In some implementations, the attachment lugs 326 and the attachment channels 328 may be different from the dovetail lugs and retention channels, respectively, but may still engage with the dovetail lugs and retentions channels of the mounting rail. Further, in the illustrated implementation, the dovetail lug 304 may be part of a plurality of dovetail lugs 304 arranged in an array across a base 302 of the mounting rail 300. The plurality of dovetail lugs 304 may be spaced apart from each other and arranged so as to define a plurality of retention channels 314. The plurality of attachment lugs 326 may engage with the plurality of retention channels 314, and the plurality of dovetail lugs 304 may engage with the plurality of attachment channels 328 such that the device mount 320 is retained to, fixed to, or securably attached to the mounting rail 300.

In some implementations, the plurality of dovetail lugs 304 and the plurality of attachment lugs 326 may interlock with each other and/or mesh with each other in a secure fashion in order to secure the device mount 320 to the mounting rail 300. In some implementations, when the mounting rail 300 is engaged with the device mount 320, each dovetail lug 304 may have a bottom portion that may be engaged with or disposed in a channel throat of the attachment channel 328 within which the dovetail lug 304 is retained. Similarly, each attachment lug 326 may also have a bottom portion that may be engaged with or disposed in a channel throat of the retention channel 314 within which the attachment lug 326 is retained. In yet further implementations, the dovetail lugs, retention channels, attachment lugs, and attachment channels may all have matching trapezoidal cross-sections, so as to securably engage with each other.

In some implementations, the device mount 320, or the attachment portion 322 thereof, may slidably engage with the mounting rail 300 in a sufficiently tight manner so as to not easily slide out, or accidentally become disengaged. In other words, the device mount 320 may have a press fit, interference fit, and/or a friction fit with the mounting rail 300. In yet further implementation, the attachment portion 322 may engage with the mounting rail 300 such that the device mount 320 is retained to the mounting rail 300, and such that the engagement of the lugs and channels of the device mount 320 with the lugs and channels of the mounting rail 300 prevent the device mount 320 from pulling from or being removed from the mounting rail 300 in a direction similar to direction 315. Direction 315 may be lateral to an insertion direction of the device mount 320 onto the mounting rail 300.

Figure 4A:
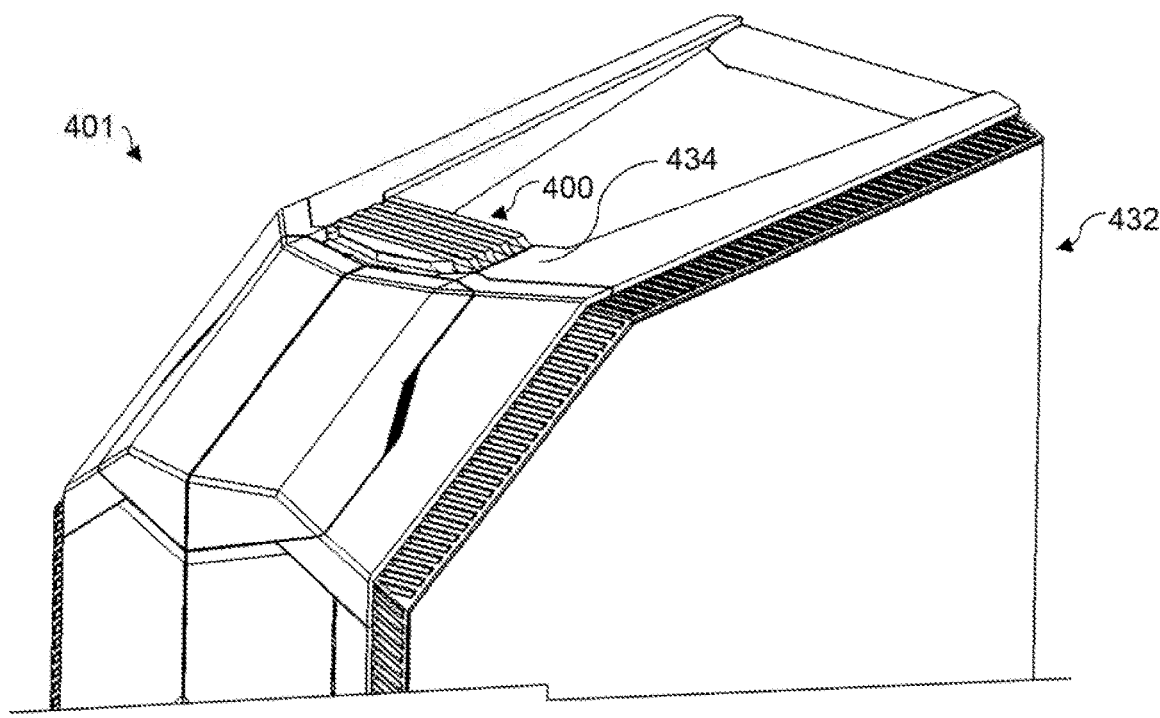
FIG. 4A is a perspective view of an example device enclosure having an example mounting rail.

Referring now to FIG. 4A, a perspective view of an example device enclosure 401 is illustrated. In some implementations, the device enclosure 401 may be an enclosure for an electronic device, for example, a computing device. Therefore, in some implementations, the device enclosure 401 may be referred to as a computing device enclosure 401. The computing device enclosure 401, in some implementations, may be a case or housing for a PC, notebook computer, workstation, desktop computer, computer tower, server housing, or another type of computing device enclosure. In other implementations, the device enclosure 401 may be an enclosure for another type of electronic device, other than a computing device. The device enclosure may include a chassis 432, in some implementations. The chassis 432 may refer to a structural component, frame, cage, or another portion or element of the device enclosure 401. In some implementations, the chassis 432 may refer to the enclosure itself, or a housing or case thereof, or another portion of the device enclosure 401.

In some implementations, the device enclosure 401 may include a mounting rail 400. Example mounting rail 400 may be similar to other above-described example mounting rails. Further, the similarly-named elements of example mounting rail 400 may be similar in function and/or structure to the respective elements of other example mounting rails, as they are described above. In further implementations, the device enclosure 401 may include a dovetail lug disposed on an exterior surface 434 of the chassis 432, and a retention channel disposed adjacent to the dovetail lug and at least partially defined by either a front retention surface or a back retention surface of the dovetail lug. In the illustrated implementation, the dovetail lug and/or the retention channel may be part of, or disposed on, the mounting rail 400 as described with reference to other example mounting rails above. As such, the mounting rail 400 may be disposed on or attached to the exterior surface 434. The exterior surface 434 is just one example exterior surface, and the mounting rail 400, or the dovetail lug and/or retention channel thereof, may be disposed on or attached to any number of exterior surfaces of the enclosure, or the chassis 432 thereof. In some implementations, the mounting rail 400, or the dovetail lug and/or retention channel thereof, may be part of the chassis 432, i.e., may be unitarily integrated into the chassis 432. In other implementations, the mounting rail 400, or the dovetail lug and/or retention channel thereof, may be removable or detachable from the chassis 432.

Figure 4B:
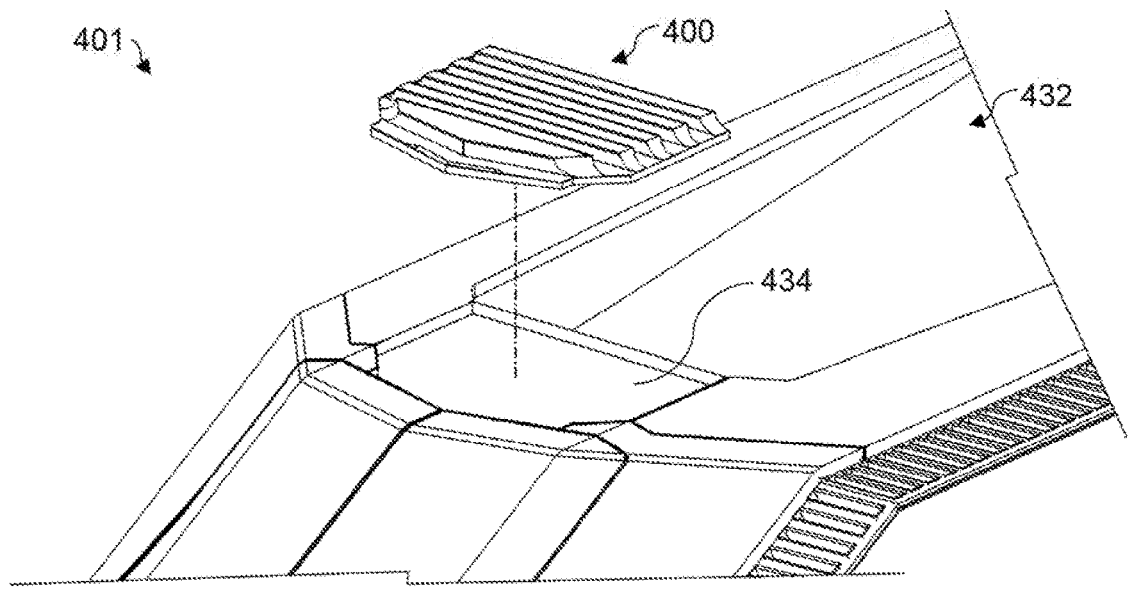
FIG. 4B is a perspective view of an example device enclosure having an example mounting rail.

Referring now to FIG. 4B, a detail perspective view of the device enclosure 401 is illustrated wherein the mounting rail 400 is removed from the chassis 432. In some implementations, the mounting rail 400 may be detachable from the chassis 432 as illustrated. In other implementations, the mounting rail 400 may be detachable in other manners or through other mechanisms. In some implementations, the mounting rail 400 may be assembled on to the chassis 432, the external surface 434 thereof, or any other external surface thereof, with mechanical fasteners such as screws, bolts, pins, clips, tabs, or other mechanical fasteners. In other implementations, the mounting rail 400 may be assembled on to or attached to the chassis 432 by being inserted into a receiving or retaining slot. Such a slot may engage with the mounting rail 400, or a base thereof, in a dovetail manner in order to retain the mounting rail to the chassis 432.

Figure 4C:
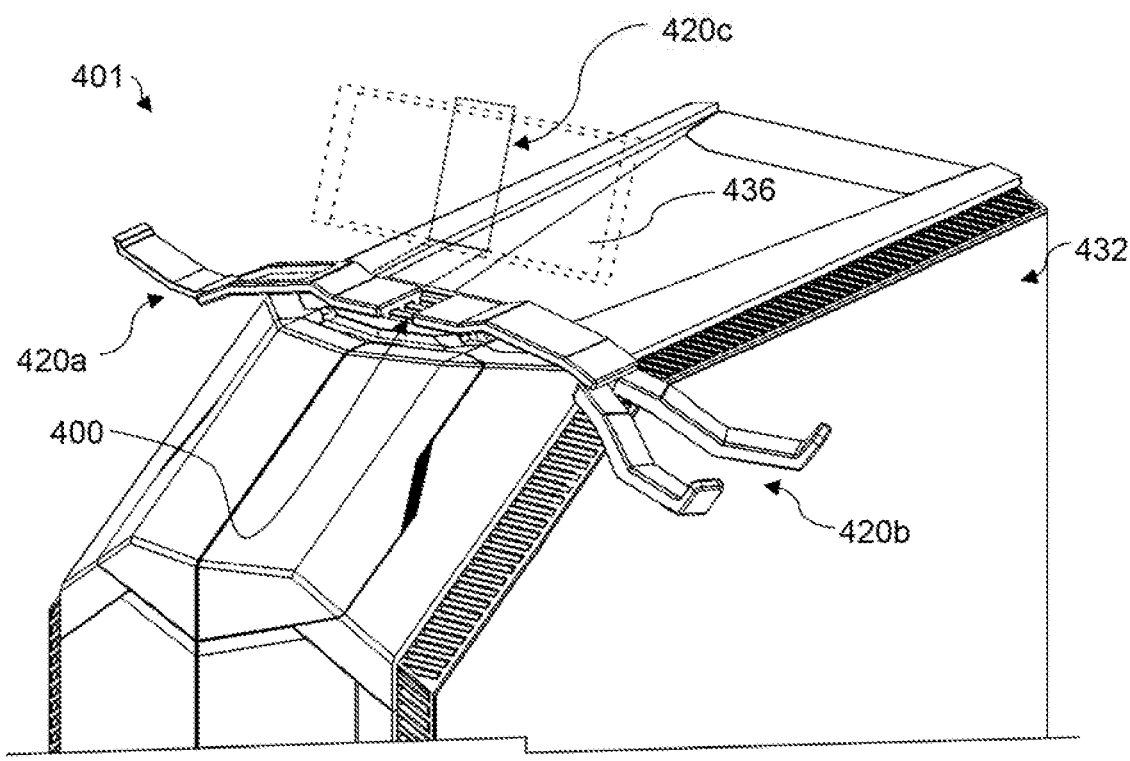
FIG. 4C is a perspective view of an example device enclosure having an example mounting rail.

Referring now to FIG. 4C, a perspective view of example device enclosure 401 is illustrated wherein the mounting rail 400 is engaged with several examples of device mounts. Such example device mounts 420a, 420b, and 420c, (hereinafter collectively referred to as device mounts 420) may be engaged with a dovetail lug and/or a retention channel of the mounting rail 400, and in further implementations, may be engaged with a plurality of dovetail lugs and retention channels. Each example device mount 420 may be held or fixed to the mounting rail 400, and thus the device enclosure 401, through such an engagement with the plurality of dovetail lugs and/or retention channels. Device mounts 420 may have a variety of arms, hangers, tabs, posts, cradles, or other structures and components, with or on which accessories or peripheral devices may be disposed in order to stow such devices and/or keep such devices out of the way or easily accessible. Such accessories or peripheral devices may include headphones, speakers, microphones, mobile devices, mobile device mounts or stands, antennas, mice, joysticks or other game controllers, virtual reality headsets, or other accessories or peripheral devices. In some implementations, referring to example device mount 420c, accessories or peripheral devices may be engaged with the device mount 420c in order to be held or cradled while the device is utilized. For example, in the illustrated implementation, example accessory 436 (shown in phantom) is held or cradled by device mount 420c such that the accessory 436 may be viewed or interacted with by a user. In further implementations, other device mounts, which may have a variety of structures and components, not shown herein are contemplated to be engageable with the mounting rail 400.

What is claimed is:

1. A mounting rail, comprising:
   a base; and
   a plurality of dovetail lugs extending from the base and along a width of the base, wherein the plurality of dovetail lugs are arranged in an array across the base, each dovetail lug of the plurality of dovetail lugs are spaced apart from an adjacent dovetail lug so as to define a retention channel and wherein the retention channel comprises a channel floor having a floor width along a length of the plurality of dovetail lugs and a channel throat having a throat width, smaller than the floor width, comprising:
   a bottom portion having a first thickness; and
   a top portion having a second thickness, larger than the first thickness,
   wherein the bottom portion and the top portion define a front overhang and a back overhang of the dovetail lug.

2. The mounting rail of claim 1, wherein the channel throat of the retention channel is defined by the front overhang of one dovetail lug of the plurality of dovetail lugs and the back overhang of an adjacent dovetail lug of the plurality of dovetail lugs.

3. The mounting rail of claim 2, wherein the retention channel is one of a plurality of retention channels defined by the plurality of dovetail lugs and arranged in an array that is alternatingly disposed along the plurality of dovetail lugs.

4. The mounting rail of claim 1, wherein the dovetail lug has a substantially trapezoidal cross-section.

5. The mounting rail of claim 1, wherein the dovetail lug has a substantially T-shaped cross-section.

6. A mounting system, comprising:
   a device mount, comprising:
      an attachment portion having an attachment lug; and
      a device portion fixed to the attachment portion to engage with a device; and
   a mounting rail, comprising:
      a base; and
      a dovetail lug extending from the base, comprising:
         a bottom portion having a first thickness;
         a top portion having a second thickness, larger than the first thickness;
         a front overhang extending along a front edge of the dovetail lug and extending from the bottom portion to the top portion; and
         a back overhang extending along a back edge of the dovetail lug and extending from the bottom portion to the top portion.

7. The mounting system of claim 6, wherein the mounting rail further comprises a first dovetail lug and a second dovetail lug spaced apart from the first dovetail lug so as to define a retention channel in between the first dovetail lug and the second dovetail lug, the retention channel having a matching cross-section to that of the attachment lug so as to receive and retain the attachment lug.

8. The mounting system of claim 7, wherein the attachment portion of the device mount further comprises a first attachment lug and a second attachment lug spaced apart from the first attachment lug so as to define an attachment channel, the attachment channel having a matching cross-section to that of the dovetail lug so as to receive and retain the dovetail lug of the mounting rail.

9. The mounting system of claim 6, wherein the attachment lug is part of a plurality of attachment lugs arranged in an array across the attachment portion so as to define a plurality of attachment channels, and the dovetail lug is part of an array of dovetail lugs arranged in an array across the base of the mounting rail so as to define a plurality of retention channels, the plurality of attachment lugs to engage with the plurality of retention channels and the plurality of dovetail lugs to engage with the plurality of attachment channels such that the device mount is retained to the mounting rail.

10. A computing device enclosure, comprising:
   a chassis;
   a dovetail lug disposed on an exterior surface of the chassis, wherein the dovetail lug is detachable from the chassis, the dovetail lug comprising:
      a front retention surface; and
      a back retention surface,
         wherein the front retention surface and the back retention surface each extend outward from a bottom portion of the dovetail lug to a top portion of the dovetail lug so as to define a front overhang and a back overhang, and
   a retention channel disposed adjacent to the dovetail lug and partially defined by either the front retention surface or the back retention surface.

11. The computing device enclosure of claim 10, further comprising a plurality of dovetail lugs arranged in an array on the chassis, each dovetail lug spaced apart from an adjacent dovetail lug so as to define a plurality of retention channels, each retention channel to receive and retain an attachment lug of a device mount so as to fix the device mount to the chassis.

12. The computing device enclosure of claim 10, wherein the dovetail lug is unitarily integrated into the chassis.

* * * * *